(12) United States Patent
Guruswamy et al.

(10) Patent No.: US 7,179,338 B2
(45) Date of Patent: Feb. 20, 2007

(54) CONTROL OF ENGINEERING PROCESSES USING MAGNETOSTRICTIVE ALLOY COMPOSITIONS

(75) Inventors: Sivaraman Guruswamy, Salt Lake City, UT (US); Kevin Nguyen, West Valley, UT (US); Pinai Mungsantisuk, Chonburi (TH); Rob Corson, Salt Lake City, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 0 days.

(21) Appl. No.: 11/091,955

(22) Filed: Mar. 24, 2005

(65) Prior Publication Data

US 2006/0054246 A1  Mar. 16, 2006

Related U.S. Application Data

(63) Continuation of application No. PCT/US03/031065, filed on Sep. 26, 2003.

(60) Provisional application No. 60/414,156, filed on Sep. 27, 2002.

(51) Int. Cl.
*H01F 1/03* (2006.01)
*C21D 1/04* (2006.01)
(52) U.S. Cl. ................................. 148/108; 148/306
(58) Field of Classification Search .................. None
See application file for complete search history.

(56) References Cited

U.S. PATENT DOCUMENTS

| 4,242,710 | A | 12/1980 | Hempstead et al. |
| 4,438,066 | A | 3/1984 | Aboaf et al. |
| 4,615,748 | A | 10/1986 | Takino et al. |
| 5,242,762 | A | 9/1993 | Kouchiyama |
| 5,413,868 | A | 5/1995 | Matsubaguchi et al. |
| 5,527,398 | A | 6/1996 | Funayama et al. |
| 6,132,891 | A | 10/2000 | Kumura et al. |
| 6,166,276 | A | 12/2000 | Sakyu et al. |
| 6,312,530 | B1 | 11/2001 | Kojima et al. |
| 6,800,143 | B1 * | 10/2004 | Kakeshita et al. .......... 148/121 |
| 2004/0050172 | A1 | 3/2004 | Quandt et al. |

FOREIGN PATENT DOCUMENTS

| JP | 57-2864 | 1/1982 |
| JP | 58-153743 | 9/1983 |

(Continued)

OTHER PUBLICATIONS

Tremolet, E., Magnetostriction: Theory and Applications of Magnetoeleasticity, 1993, pp. 1-408, CRC Press.

(Continued)

*Primary Examiner*—John P. Sheehan
(74) *Attorney, Agent, or Firm*—Thorpe North & Western LLP

(57) ABSTRACT

Magnetostrictive devices and methods involving a magnetostrictive alloy having; (1) one or more of Pd, and Pt, and (2) one or more of Ni, Co, Fe, where the alloy comprises one or more of $Pd_xNi_{1-x}$, $Pd_xFe_{1-x}$, $Pd_xCo_{1-x}$, $Pt_xNi_{1-x}$, $Pt_xFe_{1-x}$, $Pt_xCo_{1-x}$, where x is less than 1, where magnetostrictive properties and diffusion, and solubility properties than variable in response to variations to a magnetic field to which the alloy is subjected. Devices and methods are used in hydrogen storage, isotopic separation, catalytic systems, actuator/sensor, and other magnetostrictive applications.

9 Claims, 12 Drawing Sheets

FOREIGN PATENT DOCUMENTS

| JP | 63-179035 | 7/1988 |
| JP | 64-73049 | 3/1989 |
| JP | 1-205504 | 8/1989 |
| JP | 3-17248 | 1/1991 |
| WO | WO 2004/053175 A2 | 6/2004 |

OTHER PUBLICATIONS

Chandrasekhar, B.S., "Magnetostriction", Encyclopedia of Physics, 1991, pp. 690-691, 2nd Edition, Eds. R. Lerner and G. Trigg, VCH publishers, New York.

Cullity, B.D., "Introduction to Magnetic Materials", 1972, pp. 1-666, Addison-Wesley, Boston, MA.

Nash, A. et al., Ni-Pd Phase Diagram in "Binary Alloy Phase Diagrams", 1990, pp. 2839-2840, 2nd Edition, Ed. In Chief: T.B. Massalski, ASM International, Materials Park, Ohio.

Ishida, K. et al., Co-Pd Phase Diagram in "Binary Alloy Phase Diagrams", 1990, pp. 1220, 1222-1223, 2nd Edition, Ed. In Chief: T. B., Massalski, ASM International, Materials Park, Ohio.

Okamoto, H., Fe-Pd phase diagram in "Binary Alloy Phase Diagrams", 1990, pp. 1749, 1751, 2nd Edition, Ed. In Chi9ef; T.B. Massalki, ASM International, Materials Park, Ohio.

Annaev, R. G. et al. "The Linear Magnetostriction of Alloys of the Ni-Pd System at Liquid Nitrogen Temperatures", Izv. Akad. Nauk. Turkm. SSR, 1968, pp. 26-30, vol. 3.

Annaev, R.G. et al., "Dependence of Longitudinal and Transversal Magnetostriction of $Ni_3Pd$ Alloy on Heat Treatment" Izv. Akad. Nauk. Turkm. SSR, 1963, pp. 10-14, vol. 6.

Tokunaga, T. et al., "Magnetostriction and Magnetic Anisotropy of Ni and Ni-Pd Alloys", J. Phys. Soc. Jpn., Oct. 1978, pp. 1232-1238, vol. 45, No. 4, Japan.

Tokunaga, T. et al, "Forced Magnetostriction of Ni-Pd Alloys", J. Phys. Soc. Jpn., 1973, p. 1103, vol. 34, Japan.

Holscher, H. et al., "Thermal Expansion and Magnetostriction in Pd-Ni Alloys Around the Critical Concentration for Ferromagnetism (=2.3 at % Ni)", J. Magn. Magn. Mater., 1980, pp. 605-606, vol. 15-18, The Netherlands.

Jen, S.U. and Chao, B.L., "Magnetostriction of polycrystalline Co-Pd Alloys", Journal of Applied Physics, May 15, 1994, pp. 5667-5669, vol. 75, (10).

Niwa, K and Shimizu, M., "Forced Magnetostriction of Dilute Pd and Pt Alloys with Fe and Co Atoms", J. Phys. F (Met. Phys.), 1982, pp. 559-569, 12, No. 3.

Smith, T.F. et al., Field Dependence of the Stiffness Constant for Dilute Palladium-Iron Alloys, Phys. Lett., Aug. 12, 1968, pp. 326-327, vol. 27A, No. 6.

Creuzet, G. et al, "Shape Magnetostriction in Pd Based Alloys and in Pd Metal", Solid State Commun., 1981, pp. 451-452, vol. 39, Great Britain.

Miyata, N. et al., "Magnetostriction Constants of $Pd_{1-x}Fe_x$ Crystals (0.1x0.6)", J. Phys. Soc. Jpn., Jun. 1986, pp. 2037-2042, vol. 55, No. 6, Japan.

Schmidt, J.E. et al., "Magnetostriction of Pd-Fe Alloys", J. Appl. Phys., 1984, pp. 1073-1080, vol. 55(4).

Ibarra, M.R. et al. "Giant Room Temperature Volume Magnetostriction in an Fe-Rh-Pd Alloy", J. Magn. and Magn. Materials, 1995, pp. 231-231, Part I.

Kubota, T et al., "Large Magnetostriction in Rapid-Solidified Ferromagnetic Shape Memory Fe-Pd Alloy", Journal of Magnetism and Magnetic Materials, 2002, pp. 551-553, vol. 239, Netherlands.

Takezawa, T. et al. "Change in Volume on Ordering of Fe—(50~80 at %) Pd Superlattice Alloys", J. Jpn. Inst. Mat., 1981, pp. 1112-1118, vol. 45, No. 11, Japan.

Bidwell, L.R., et al., "Unit-cell Dimensions of Ni-Pd Alloys at 25 and 900° C.", Acta Cryst., 1964, pp. 1473-1474, No. 17.

Voorhoeve, R.J.H., "Experimental Relationships between Catalysis and Magnetism", Proc. 19th Ann. Magn. and Magn. Mater. Conf., Nov. 13-16, 1974, Boston, MA. APS, pp. 19-32.

Savitskii, E.M. et al., "Handbook of Precious Metals", 1989, Hemisphere Publishing Corporation, New York.

Zhang, W. et al., "Hydrogen Solution in Homogeneous Pd-Fe Alloys", Journal of Alloys and Compounds, 1999, pp. 1-6, vol. 293-295.

Bryden, K.J. and Ying, J.Y., "Electrodeposition Synthesis and Hydrogen Absorption Properties of Nanostructured Palladium-Iron Alloys", Nanostructured Materials, 1997, pp. 485-488, vol. 9, No. 1-8.

Sakamoto, Y., "Nickel-Hydrogen System", 2000, pp. 137-205, Chapter 5, Japan.

Yamakawa, K. et al., "Hydrogen Permeability Measurement through Pd, Ni and Fe Membranes", Journal of Alloys and Compounds, 2001, pp. 17-23, vol. 321, Switzerland.

Frieske, H. et al.,"Paramagnetic Behaviour of Palladium-Iron and Palldium-Iron-Hydrogen Alloys", Z. Naturforsch, 1969, pp. 1801-1806, vol. A 24.

Lewis, F.A., "The Palladium Hydrogen System", 1967, pp. 1-178, Academic Press, London, New York.

Korte, N. et al., "The Dechlorination of Hydrocarbons Palladised Iron Utilized for Ground Water Purification", Platinum Metals Review, 1997, pp. 2-7, vol. 41, No. 1, United Kingdom.

Jart, A., "The Magnetic Field as an Additional Selectivity Parameter in Fat Hydrogenation", J. Amer. Oil Chemists Soc., 1997, pp. 615-617, vol. 74, No. 5.

Richardson, J.T., "Magnetism and Catalysis", J. Appl. Phys., Mar. 1978, pp. 1781-1786, vol. 49(3).

* cited by examiner

CONTROL OF ENGINEERING PROCESSES USING MAGNETOSTRICTIVE ALLOY COMPOSITIONS

CROSS REFERENCE TO RELATED APPLICATIONS

This application is a continuation of PCT International Application No. PCT/US2003/031065, filed 26 Sep. 2003, which designated the United States and claims priority to U.S. Provisional Patent Application 60/414,156, filed 27 Sep. 2002, which are each incorporated herein by reference in their entireties.

SUMMARY OF INVENTION

An aspect of the present invention involves Ni/Pd alloys and related ferromagnetic alloys having magnetostrictive properties, and having solubility and diffusion properties that are variable in response to variation in the magnetic field to which the alloy is subjected. They can be used as a hydrogen storage medium, as a catalyst, in a isotopic enrichment system, as a torque/load sensor, linear motor/actuator, or in the generation and sensing of acoustic and ultrasonic waves, or active damping and vibration/seismic isolation structures.

The alloy can be used in a method for controlling or programming the solubility and diffusion behavior in an alloy. The method comprises; providing any one or more of a $Pd_xNi_{1-x}$, $Pd_xFe_{1-x}$, $Pd_xCo_{1-x}$, and $(Pd,Pt)(Fe,Co,Ni)$ based alloy where x varies from 0 to values approaching 1, and subjecting the alloy to a magnetic field, the magnetic field of a strength to obtain a preselected solubility or diffusion property in the alloy.

Another aspect of the invention is a catalyst system for a petrochemical or like process comprising; one or more of $(Pd,Pt)_xM_{1-x}$ (M=Ni,Fe, and/or Co) based alloys, and subjecting the alloy to a variable magnetic field sufficient to controllably vary its catalytic activity in response to variation in the magnetic field.

Another aspect is a hydrogen storage system comprising; a Ni—Pd alloy or related ferromagnetic hydrogen storage alloy, a system for varying the magnetic field to which the alloy subjected to vary it solubility and diffusion properties. The variation in magnetic field can be varied to increase and control the storage and the delivery needs of the hydrogen, and the hydrogen is used in a fuel cell.

In an aspect of the invention, the hydrogen contains two or more of hydrogen (H), deuterium (D), and tritium (T) and the variation of the magnetic field causes variations in the solubility and diffusion properties that allow for isotopic separation.

In another aspect, the hydrogen may optionally contain tritium (T), and the magnetic field is varied to effect storage of the tritium.

Another aspect of the invention is highly magnetostrictive actuator and sensor using one or more of the NiPd, FePd or CoPd alloy systems.

Another aspect of the invention is a highly magnetostrictive alloy comprising a NiPd, FePd and CoPd alloy system, the composition such that the curie temperatures of these alloys is at or near room or a higher temperature. Any of these alloys can be used in a energy conversion or smart device.

NiPd alloys have a congruent melting point at a composition of Ni-45.4 at. % Pd and a temperature of 1237° C. The presence of magnetic transformation extends from pure Ni to Pd contents to greater than 95%, with a continuous decrease in Curie temperature. The large decrease in melting temperature with Pd addition and congruent melting minima indicates a lower binding energy or a low cohesion energy relative to Ni or Pd and thus lower elastic stiffness of the crystal lattice suggesting that the inter-atomic distances can be appreciably manipulated by the application of magnetic fields in these NiPd ferromagnetic alloys.

In one aspect of the invention, the invention involves the enhanced magnetostriction of Ni with a NiPd alloy at the congruent melting point minimum, at about 45.4 at. % Pd addition. Due to face centered cubic crystal structure, these alloys should have excellent mechanical properties. Similar congruent melting point minima in FePd and CoPd alloys suggest that FePd (Fe-54.6 at. % Pd and other compositions) and CoPd (Co-45 at. % Pd and other compositions) alloys would also also be good candidate alloys for enhanced magnetostriction. Substitution of Pd with Pt could also be envisaged.

The NiPd alloys of the invention also have a large solubility for hydrogen and the presence of H in NiPd alloy lattices can modify their magnetostrictive behavior. The invention disclosed here pertains to:

the choice of the NiPd, FePd and CoPd alloy systems for use as highly magnetostrictive actuator and sensor, the modification of curie temperatures of these alloys to near room or higher temperature by varying the composition to produce numerous energy conversion and smart devices, the application of the magnetostrictive distortion to (i) modifying/controlling the solubility and diffusion behavior in hydrogen storage systems involving $Pd_xNi_{1-x}$, $Pd_xFe_{1-x}$, $Pd_xCo_{1-x}$, and $(Pd,Pt)(Fe,Co,Ni)$ based alloys where x varies from 0 to values approaching 1, (ii) modifying the catalytic activity of $Pd_xM_{1-x}$ (M=NiFe, and/or Co) based alloys and other related alloys for use in hydrogenation and other chemical/electrochemical processes, and (iii) modifying and controlling diffusion behavior of hydrogen isotopes through diffusion membranes allowing efficient isotopic enrichment process, and the use of PdNi based alloys in (i) torques/load sensors based on these alloys (ii) high power actuators and sensors of physical motion with applications in motors, generation and sensing of sonic and ultrasonic waves, (iii) active damping and vibration/seismic isolation, devices.

Practical and Commercial Applications:

Practical and Commercial Applications of the present invention include:

Controlled solubility/diffusion/leakage of H in Ni—Pd based alloys and other related ferromagnetic hydrogen storage alloys using magnetic fields allows for elegant storage/delivery of hydrogen in fuel cell applications.

Control and enhancement of catalytic activity in (i) Pd and Pt based alloys containing ferromagnetic additions of Ni, Fe and Co and (ii) Ni based alloys in wide range of petrochemical and other processes.

Magnetic control of diffusion/leakage of hydrogen (H), deuterium (D) and tritium (T) in Pd alloyed with Ni allows for an elegant control/enhancement of isotopic enrichment process Magnetic control of solubility/diffusion/leakage of T in Pd alloyed with Ni allows in radioactive tritium isotope storage.

The use of PdNi based alloys and related alloys in (i) torques/load sensors, (ii) linear motors/actuators, (iii) generation and sensing of acoustic and ultrasonic waves (speakers), (iv) active damping and vibration/seismic isolation structures.

The present invention is applicable to several areas of technology, including: hydrogen storage, control of catalytic activities, magnetostriction control of diffusion/leakage of atomic species, fuel cells, actuators, sensors, ultrasonics, and acoustics. The industries in which the present may be of particular interest are: nuclear energy, electric power generating companies, petrochemical industries, fuel cells, automotive industries, sensor/actuator companies, and acoustic/ultrasonic equipment manufacturers.

DETAILED DESCRIPTION

The present invention pertains to novel uses of (Pd,Pt) (Fe,Co,Ni) based alloys or compositions that exhibit appreciable magnetostrictive behavior. Magnetostrictive (or piezo-magnetic) behavior refers to (i) reversible strains in a material in response to an applied magnetic field and (ii) changes in magnetic properties such as permeability on the application of stress. The source of the magnetostrictive strain is the interdependence of magnetic and elastic responses of a ferromagnetic material [1–3]. This magnetoelastic coupling leads to a significant shift in the positions of neighboring ions in response to the rotation of the magnetic moment by the applied field. The energy of a magnetized single crystal depends on the direction of magnetization because of the appreciable coupling of the orientation of the spin moments of the atom and the orientation of its aniostropically shaped electron charge cloud. This anisotropy energy, for a given direction of magnetization, is itself dependent on the deformation of the crystal. This deformation produces its own contribution of an elastic energy to the total energy of the crystal. Minimization of the sum of the contributions of magnetoelastic and elastic energy to the total system energy results in an anisotropic linear strain or Joule magnetostriction [1–3].

Pd and its alloys exhibit a number of interesting characteristics that make them valuable in a number of applications such as storage of H and its isotopes, diffusion membranes in isotopic enrichment, electrical contact materials, controlled thermal expansion alloys, and catalyst in a number of chemical reactions or processes involving gas/solid and liquid/solid interfaces. Addition of ferromagnetic elements Ni, Co and Fe to Pd introduces ferromagnetism in these alloys over a wide composition range [4–6]. An interesting feature in the binary Pd—Ni, Pd—Co, and Pd—Fe alloys is the rapid decrease in the melting temperature with the alloys and the presence of congruent melting point minima in these binary systems [4–6]. Both Ni—Pd and Co—Pd also a room temperature fcc solid solution phase over a wide range of composition. Due to their face centered cubic crystal structure, these alloys are expected to have excellent mechanical properties. Further, the addition of Pd to Ni, Co and Fe can enhance the magnetostriction of Ni, Co and Fe respectively [8–20]. This characteristic is central to the invention.

Figure 1:
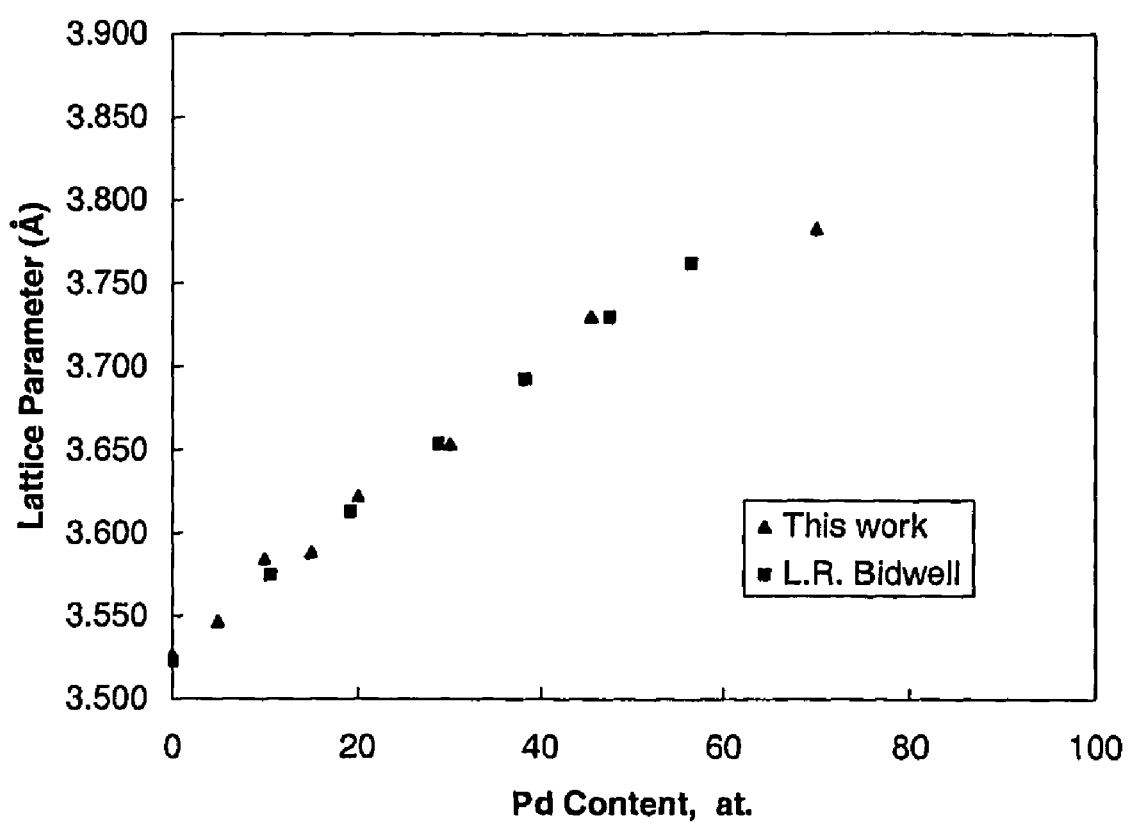
FIG. 1. Plot of lattice parameter versus Pd content in Ni—Pd alloys (· this work, + Ref. [21]).
Figure 2:
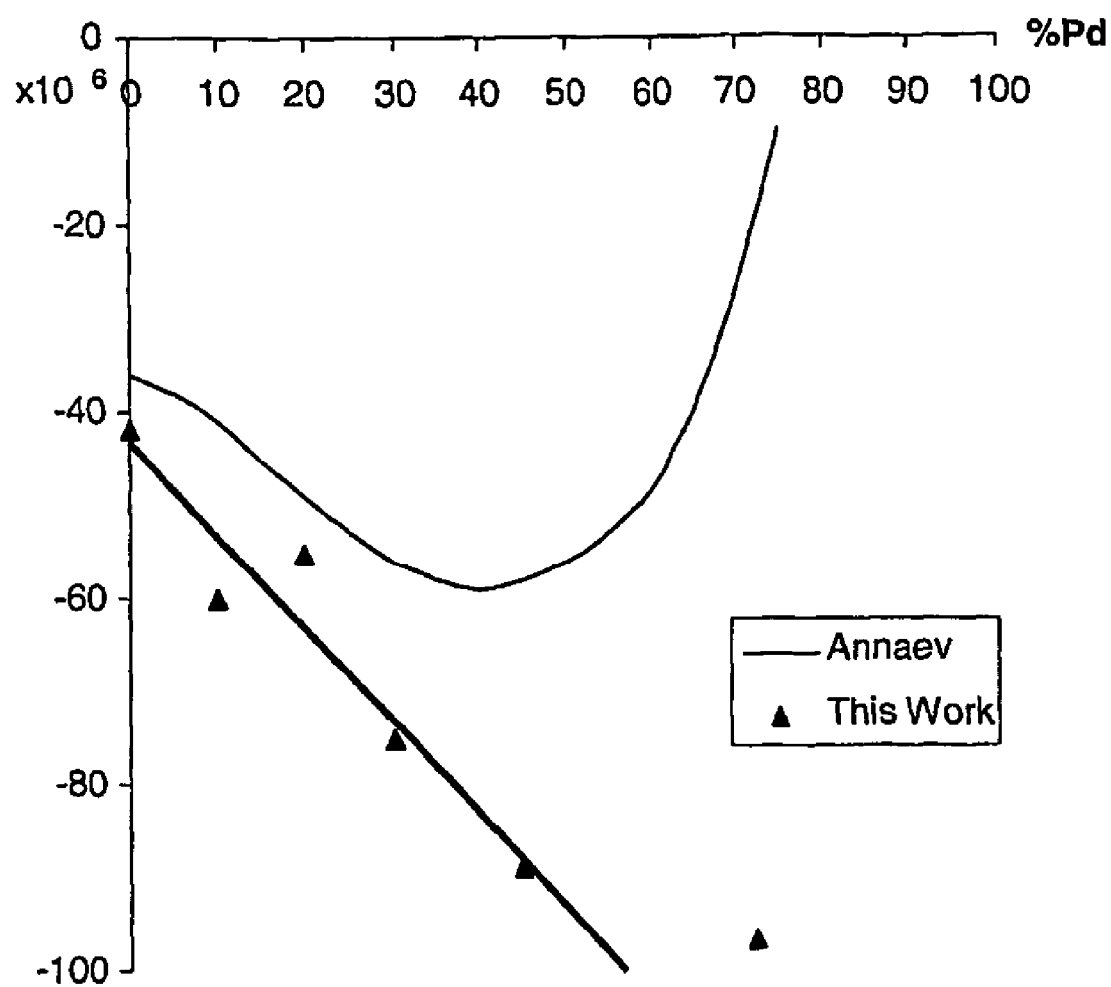
FIG. 2. Room temperature magnetostriction data for polycrystalline NiPd alloys from the present work compared with Ref. [7,8].
Figure 3A:
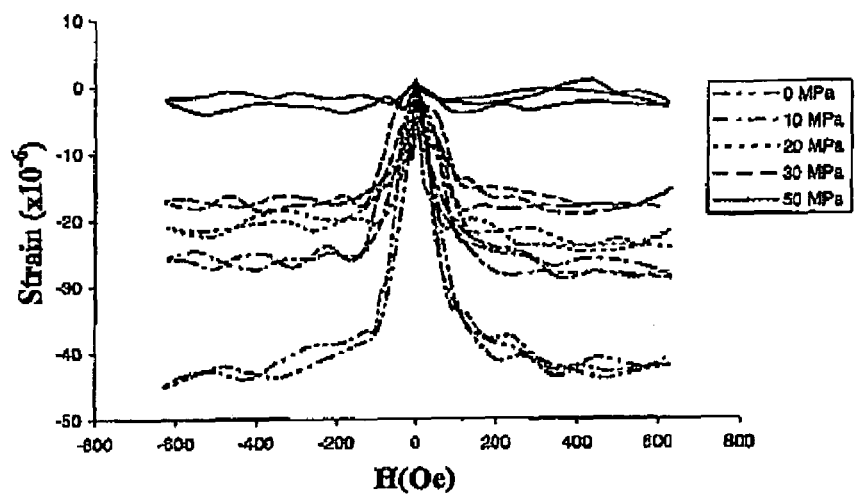
FIG. 3. Magnetostriction curves of (a) pure Ni and (b) Ni-70 at. % Pd polycrystalline alloy rods at various applied compressive stress levels.
Figure 3B:
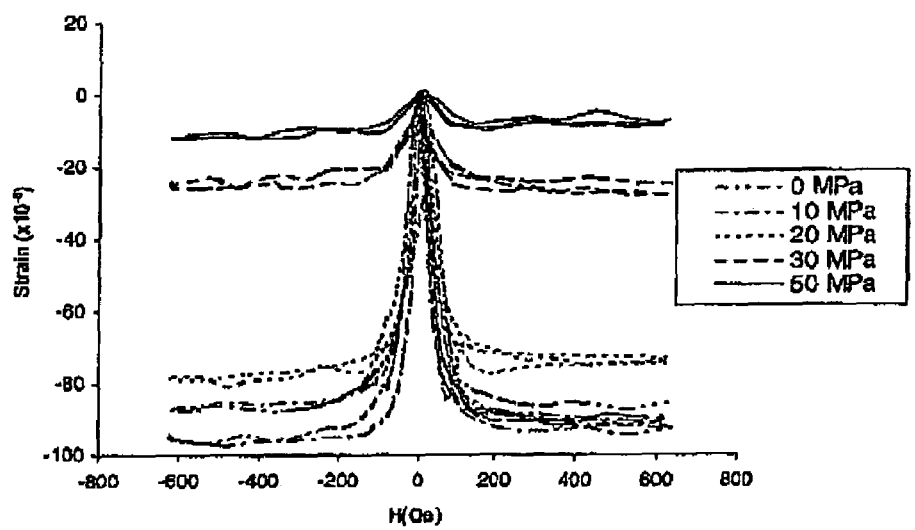
Figure 4A:
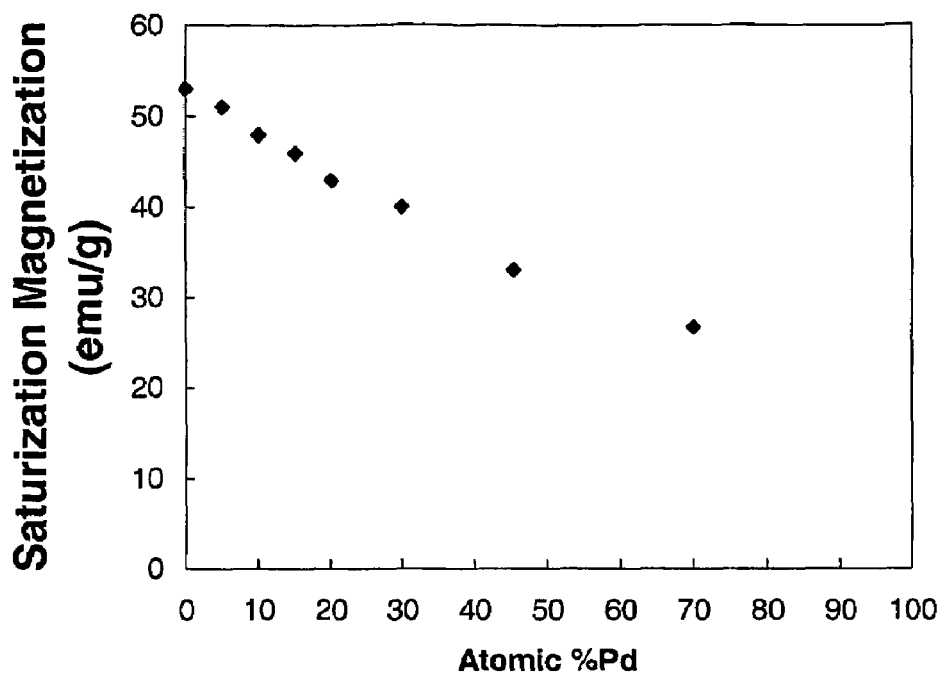
FIG. 4. (a) Hysteresis curves and (b) Saturation Magnetization versus Pd content in Ni—Pd Alloys FIG. 5. Variation of lattice parameter with Pd content in Co—Pd.
Figure 4B:
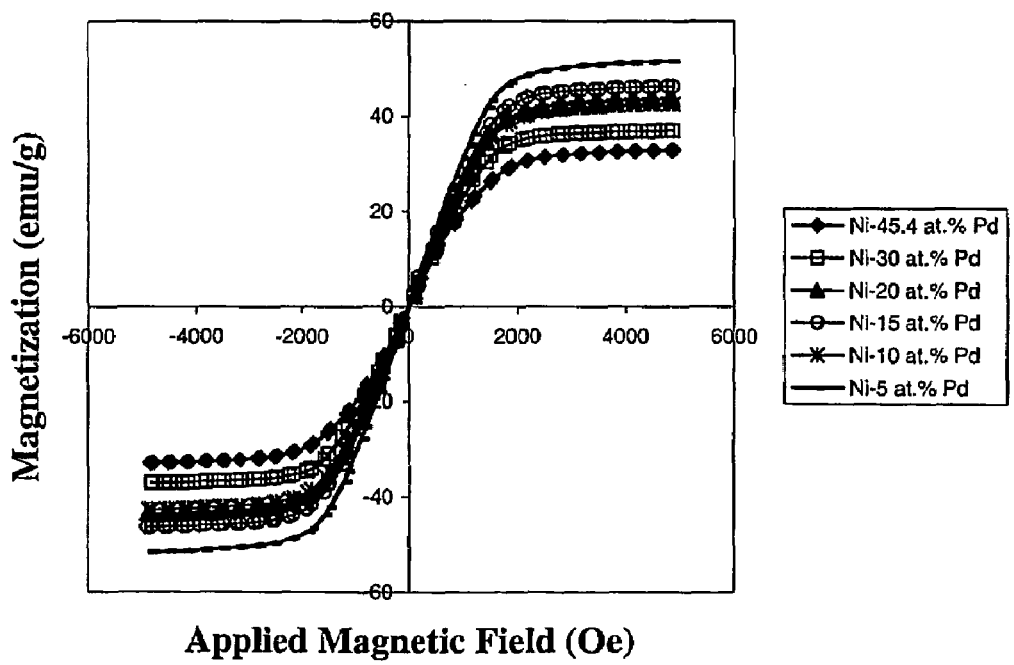

NiPd alloys have a congruent melting point at a composition of Ni-45.4 at. % Pd and a temperature of 1237° C. [4]. The Ni—Pd alloy system exhibits of a continuous solid solution across the entire composition range and the presence of paramagnetic to ferromagnetic transformation extends from pure Ni to Pd contents that are greater than 95%, with a continuous decrease in Curie temperature. Addition of Pd to Nickel increases the lattice parameter and the lattice parameter variation shows a positive deviation from Vagard's law (that suggests linear variation with composition) (FIG. 1) [the present work, 21]. A large rate of decrease in melting temperature is observed with Pd addition to Ni or Ni addition to Pd. The lower the melting temperature, the lower the binding energy or a low cohesion energy of the atoms in the solution relative to pure Ni or pure Pd. The lower cohesion energy indicates lower elastic stiffness of the crystal lattice suggesting that the interatomic distances can be more easily manipulated by the application of magnetic fields. Thus an appreciable magnetostriction can be expected in NiPd ferromagnetic alloys having appreciable saturation magnetic moments. First reported magnetostriction measurements of NiPd alloys were carried out by Annaev and coworkers [7,8]. Subsequent magnetostriction investigations on NiPd alloys have been carried out by other groups [9–11]. The magnetostriction data of Annaev et al. [7,8] for polycrystalline NiPd alloy rods parallel to the applied field direction presented in FIG. 2 and Table 1 along with recent data from the present work. The magnetostriction strain values observed in the present work in the direction parallel to the applied filed are higher than the values of Annaev et al [7,8]. The magnetostriction in Ni-70 at Pd alloy observed in the present work is about −95 ppm under no load conditions. FIG. 3 presents the magnetostriction data for polycrystalline cast rods of pure Ni and Ni-70 at. % Pd under applied compressive stress levels from 0 to 50 MPa. The data show that the polycrystalline Ni—Pd alloys exhibit large negative magnetostriction at low applied field with very small hysteresis. Data for arc melted and cast Ni, Ni-5 at. % Pd, Ni-10 at. % Pd, Ni-15 at. % Pd, Ni-30 at. % Pd, Ni-45.4 at. % Pd, and Ni-70 at. % Pd at different applied compressive stresses are shown in Table 2. Appreciable magnetization is present at room temperature in these alloys at a Pd content of about 70 a % as can be seen from FIG. 4 that presents data from present work that is consistent with earlier investigations [4].

TABLE 1

Magnetostriction data of polycrystalline NiPd alloys parallel to applied field.

| Composition | Magnetostriction at RT This work | Magnetostriction at RT Ref. [4] | Magnetostriction At Liq. N$_2$ Ref. [4] |
|---|---|---|---|
| Pure Ni | −42 | −36 | −38.8 |
| Ni—10Pd | −60 | −41 | |
| Ni—20Pd | −55 | −49 | −59.21 |
| Ni—30Pd | −75 | −56 | |
| Ni—40Pd | | −59 | −85.52 |
| Ni—45.4Pd | −89 | −58 | |
| Ni—50Pd | | −56 | −108.5 |
| Ni—60Pd | | −48 | −127.97 |
| Ni—70Pd | −95 | −27 | −116.4 |

TABLE 2

Magnetostriction Data for Ni—Pd Alloys

| Composition (% Pd) | 0 MPa | 10 MPa | 20 MPa | 30 MPa | 50 MPa |
|---|---|---|---|---|---|
| 0 | −42 | −28 | −24 | −18 | −3 |
| 10 | −60 | NA | NA | NA | NA |
| 20 | −55 | −33 | −21 | −20 | −14 |
| 30 | −75 | NA | NA | NA | NA |
| 45.4 | −89 | −92 | −79 | −37 | −20 |
| 70 | −95 | −86 | −77 | −24 | −11 |

Co—Pd phase diagram is similar to that of Ni—Pd phase diagram except for the presence of hcp to fcc solid state phase transition for compositions less than about 13% [5]. CoPd alloys have a congruent melting point at a composition of Ni-45 at. % Pd and a temperature of 1217° C. Similar to NiPd system the melting temperature large decrease in the melting temperature with Pd addition to Ni (or Ni addition to Pd). The Co—Pd alloy system exhibits a continuous solid solution across the entire composition range at a higher temperature and from 13 to 100% Pd at room temperature. The presence of paramagnetic to ferromagnetic transformation extends from pure Co to Pd contents to greater than 95%, with a continuous decrease in Curie temperature. Rapid quenching from higher temperature can result in a metastable room temperature fcc phase in Co rich alloys containing less than 13 a % Pd. Co alloys.

Figure 5:
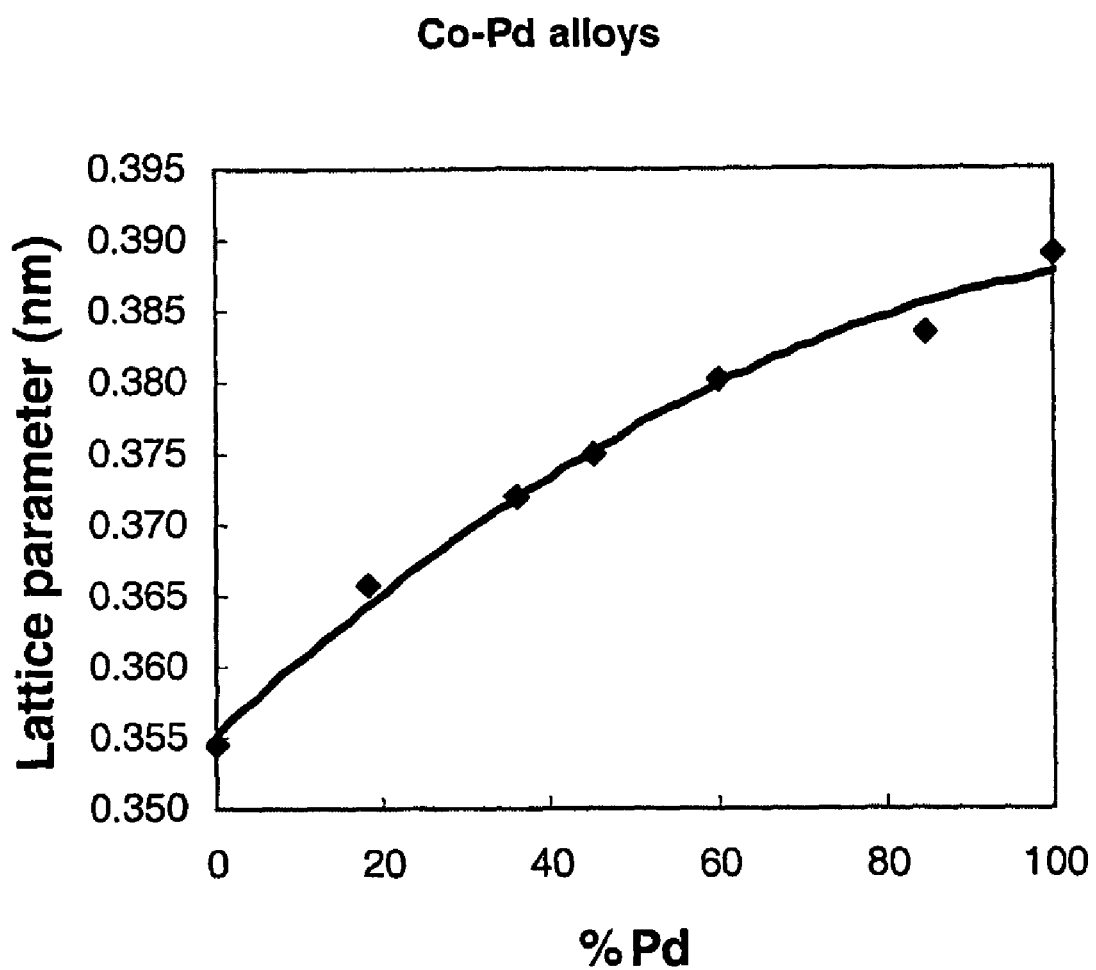
Figure 6:
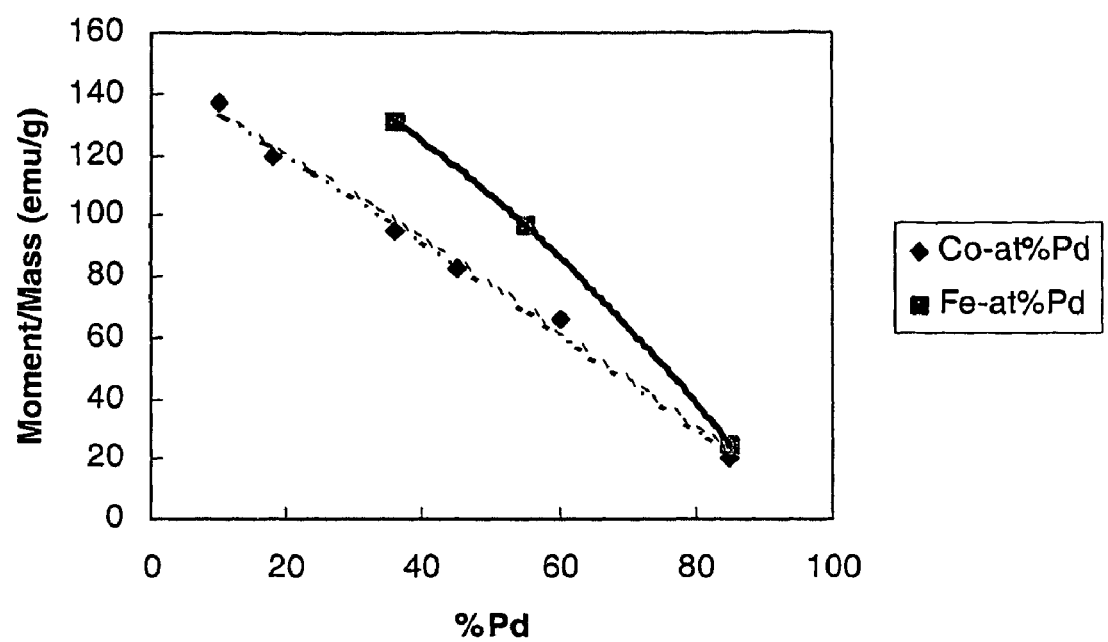
FIG. 6. Magnetization versus Pd concentration in Co—Pd and Fe—Pd alloys.
Figure 7:
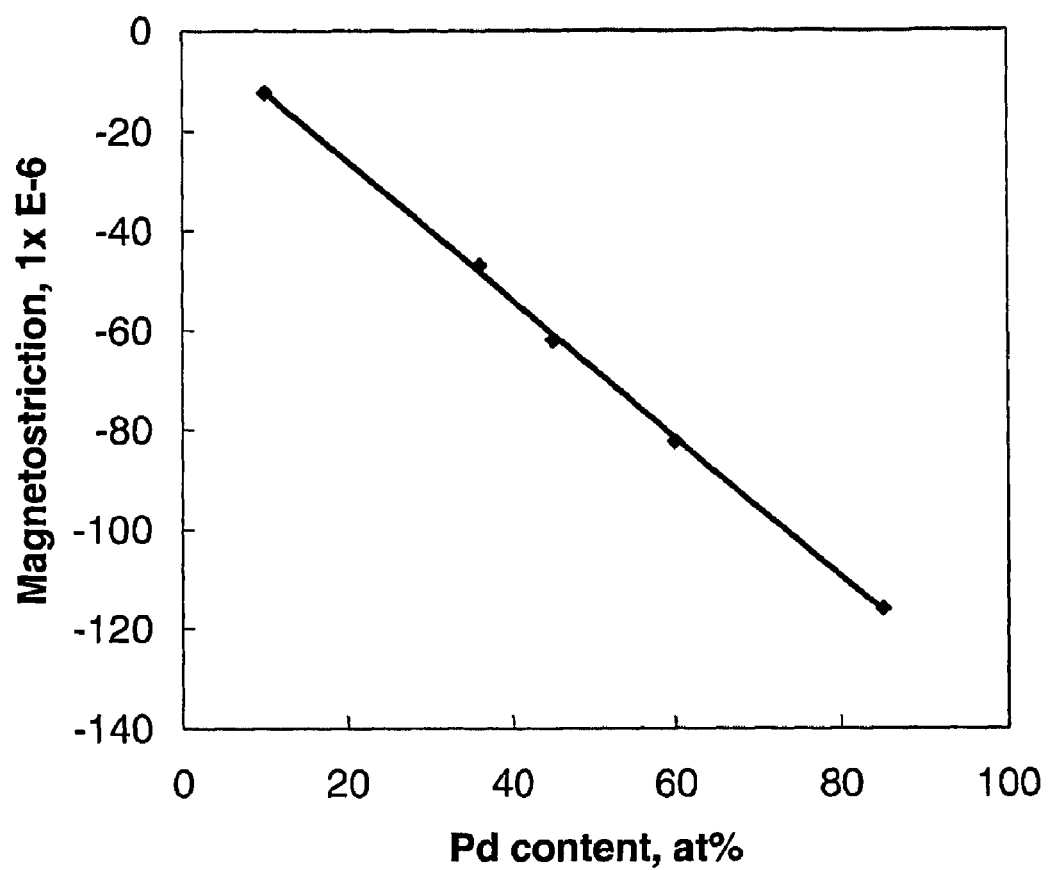
FIG. 7. Magnetostriction versus Pd content in polycrystalline Co—Pd alloys with no applied stress.
Figure 8:
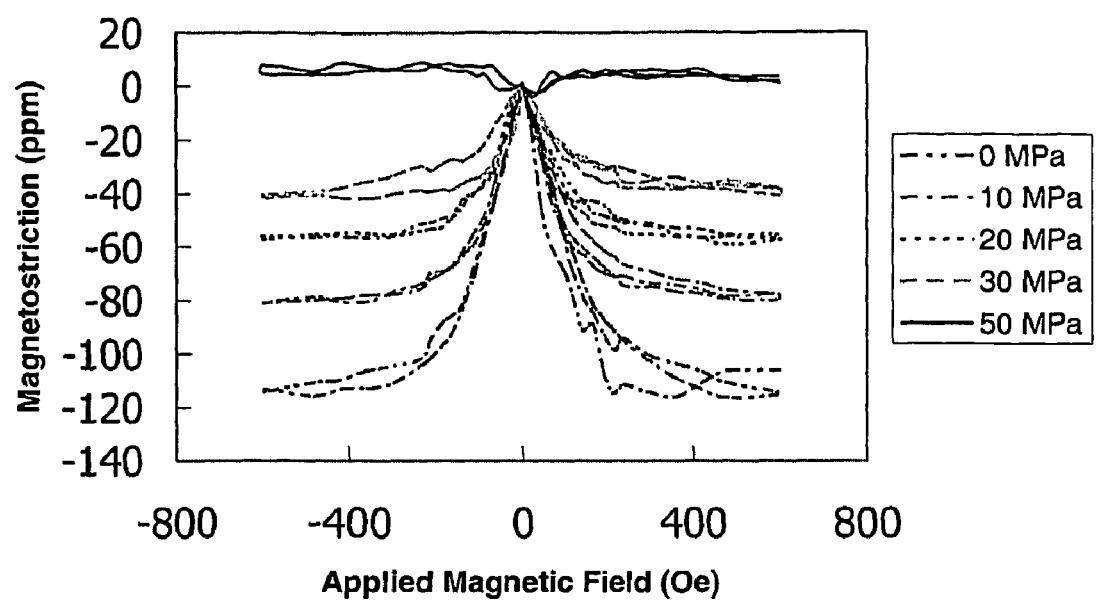
FIG. 8. Magnetostriction curves for polycrystalline Co-85 a % Pd alloy under different applied compressive stress levels.

Variation of lattice parameter with Pd content in Co—Pd alloys is shown in FIG. 5. Magnetization versus Pd concentration plot (FIG. 6) shows that appreciable saturation magnetization values are present even in alloys with Pd contents as high as 85 a % Pd [this work, 5]. Magnetostriction versus Pd content in Co—Pd alloys is shown in FIG. 7. No load magnetostriction values obtained in the present work are consistent with prior work except for the lower saturation fields for samples in this work [12,13]. FIG. 8 shows magnetostriction data for Co-85 a % Pd alloy under different applied compressive stress levels. Table 3 presents magnetostriction data for various Co—Pd cast polycrystalline alloys at various applied stress levels.

TABLE 3

Magnetostriction data for various Co—Pd cast polycrystalline alloys at various applied stress levels.

| Alloys | Applied Load (MPa) | Estimated Maximum Strain (ppm) |
|---|---|---|
| Co10%Pd | — | −12.29 |
| | 10 C | −13.73 |
| | 20 C | −12.36 |
| | 30 C | −10.29 |
| | 50 C | −4.78 |
| Co18%Pd | — | −47.59 |
| | 10 C | −40.30 |
| | 20 C | −31.31 |
| | 30 C | −22.94 |
| | 50 C | −6.35 |
| Co36%Pd | — | −46.93 |
| | 10 C | −47.93 |
| | 20 C | −48.23 |
| | 30 C | −46.08 |
| | 50 C | −27.66 |
| Co45%Pd | — | −61.98 |
| | 10 C | −55.86 |
| | 20 C | −53.34 |
| | 30 C | −45.65 |
| | 50 C | −32.35 |
| Co45%Pd(R) | — | −76.77 |
| | 10 C | −56.86 |
| | 20 C | −36.60 |
| | 30 C | −13.92 |
| | 50 C | 21.41 |
| Co60%Pd | — | −82.27 |
| | 10 C | −77.77 |
| | 20 C | −71.39 |
| | 30 C | −62.20 |
| | 50 C | −33.13 |
| Co85%Pd | — | −115.98 |
| | 10 C | −79.84 |
| | 20 C | −57.88 |
| | 30 C | −40.37 |
| | 50 C | 6.78 |

Figure 9:
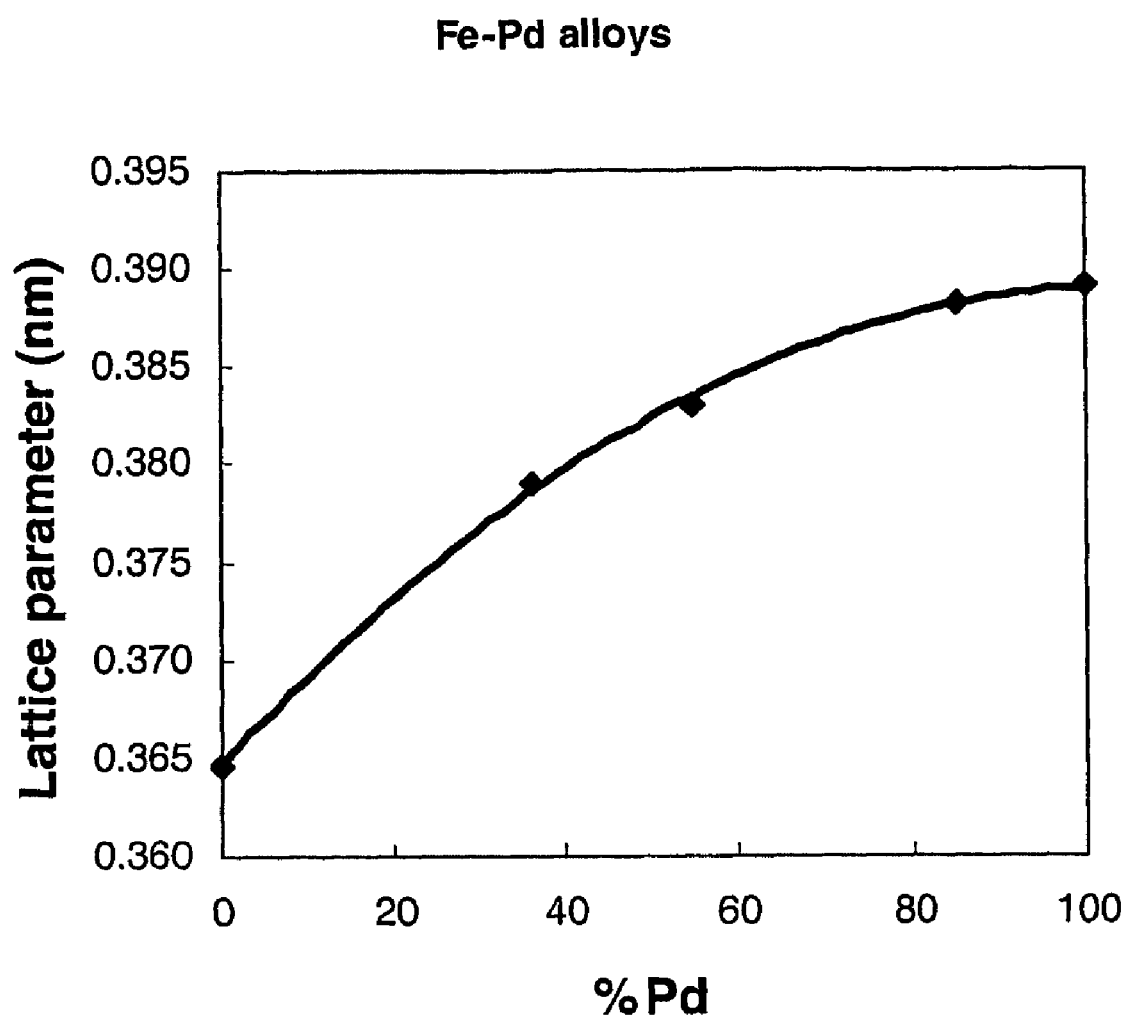
FIG. 9. Variation of lattice parameter with Pd content in Fe—Pd alloys.

Fe—Pd system also shows a congruent melting point and minima at 55 a % Pd but differs significantly from that of Co—Pd and Ni—Pd phase diagrams by the presence of ordered low temperature phases FePd and FePd$_3$ [6]. The lattice parameter variation with Pd concentration in Fe—Pd is shown in FIG. 9 which shows a positive deviation from Vagard's law. The data for fcc iron and pure Pd in this plot correspond to data from literature. The magnetization versus Pd content shows appreciable magnetization at contents as high as 85 a % Pd (FIG. 6).

Figure 10:
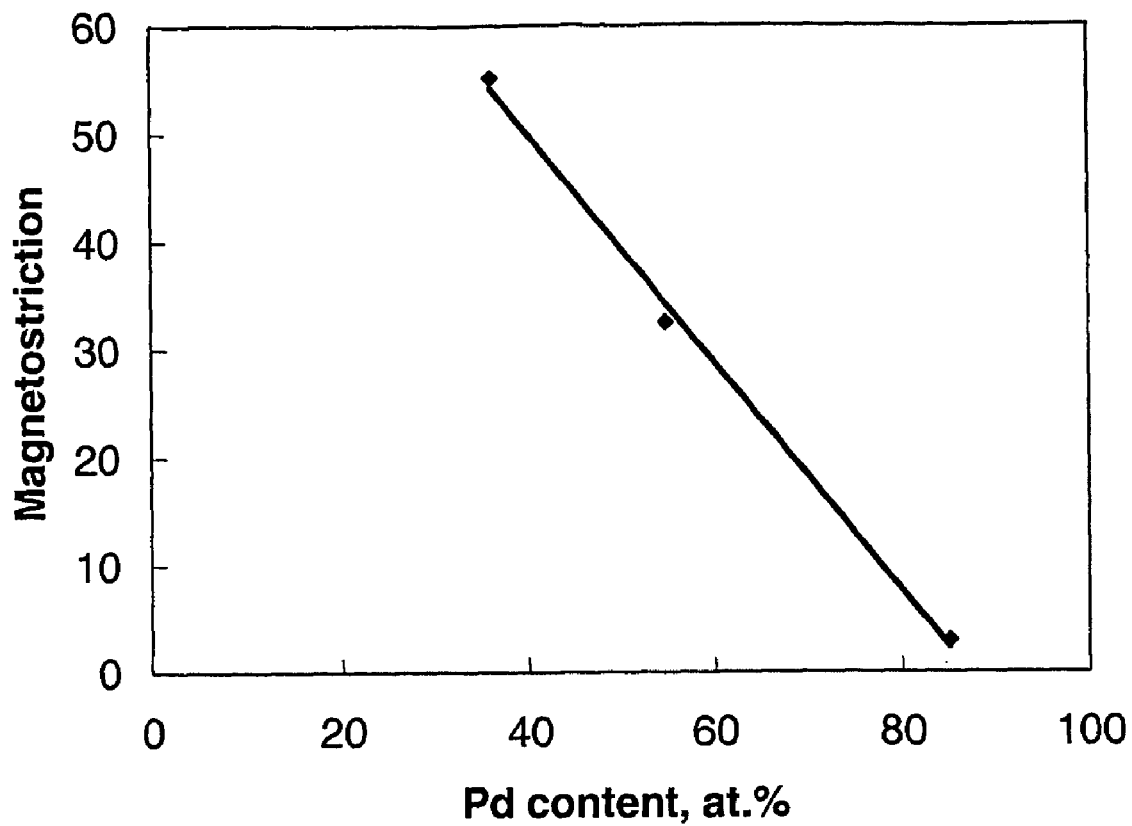
FIG. 10. Magnetostriction versus Pd content in polycrystalline Fe—Pd alloys with no applied stress.
Figure 11:
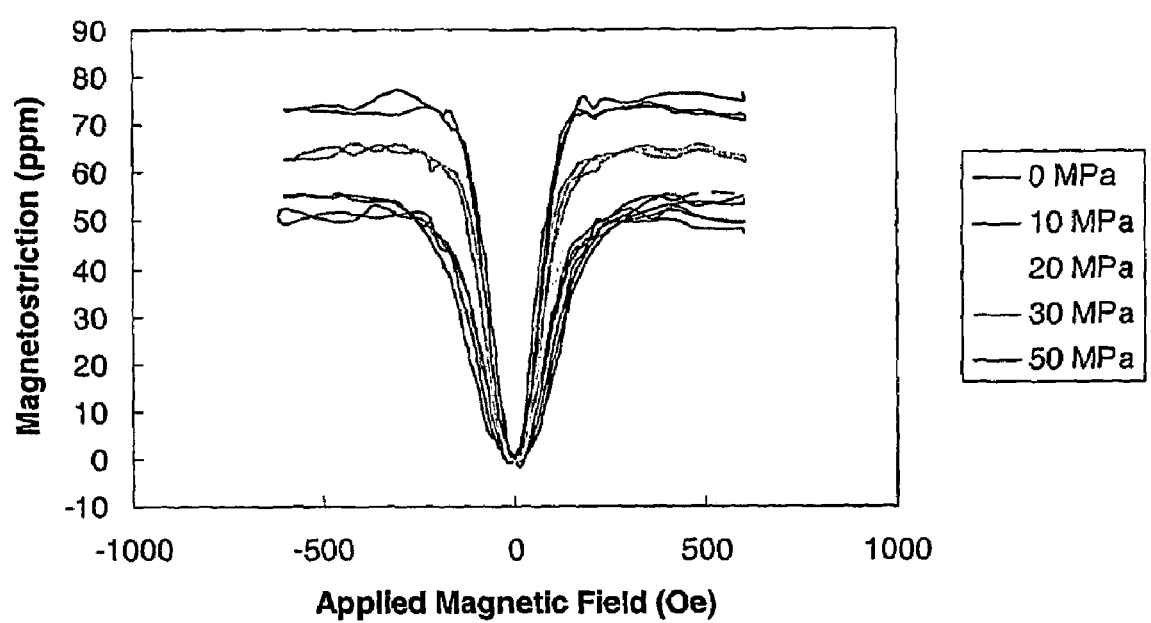
FIG. 11. Magnetostriction curves for polycrystalline Fe-36 a % Pd alloy under different applied compressive stress levels.

Magnetostriction versus Pd content data in various cast polycrystalline Fe—Pd alloys for the case of no applied stress is presented in Table 4. The samples require low fields for magnetic saturation. No load magnetostriction values obtained in the present work are consistent with prior work. FIG. 10 shows magnetostriction data for Fe-36 a % Pd alloy under different applied compressive stress levels. The values obtained in the three alloys that were examined are much lower than the values obtained in CoPd and NiPd alloys. Table 3 presents magnetostriction data for various Fe—Pd alloys at various applied stress levels. Pd rich PdFe alloys show a much weaker magnetostriction effect while the Pd rich PdCo and PdNi alloys show strong shape magnetostriction consistent with the work of Creuzet et al. [15] and confirming the existence of local orbital moments on Co and Ni atoms in Pd.

TABLE 4

Magnetostriction data for various Co—Pd cast polycrystalline alloys at various applied stress levels.

| Alloys | Applied Load (MPa) | Estimated Maximum Strain (ppm) |
|---|---|---|
| Fe36%Pd | — | 55.16 |
| | 10 C | 52.06 |
| | 20 C | 58.99 |
| | 30 C | 65.53 |
| | 50 C | 76.14 |
| Fe54.9%Pd | — | 32.48 |
| | 10 C | 34.77 |
| | 20 C | 38.40 |
| | 30 C | 40.06 |
| | 50 C | 48.93 |
| Fe85%Pd | — | 2.92 |
| | 10 C | 2.82 |
| | 20 C | 2.19 |
| | 30 C | 2.59 |
| | 50 C | 3.64 |

Control of Solubility and Diffusivity of Hydrogen and its Isotopes in Pd

Figure 12:
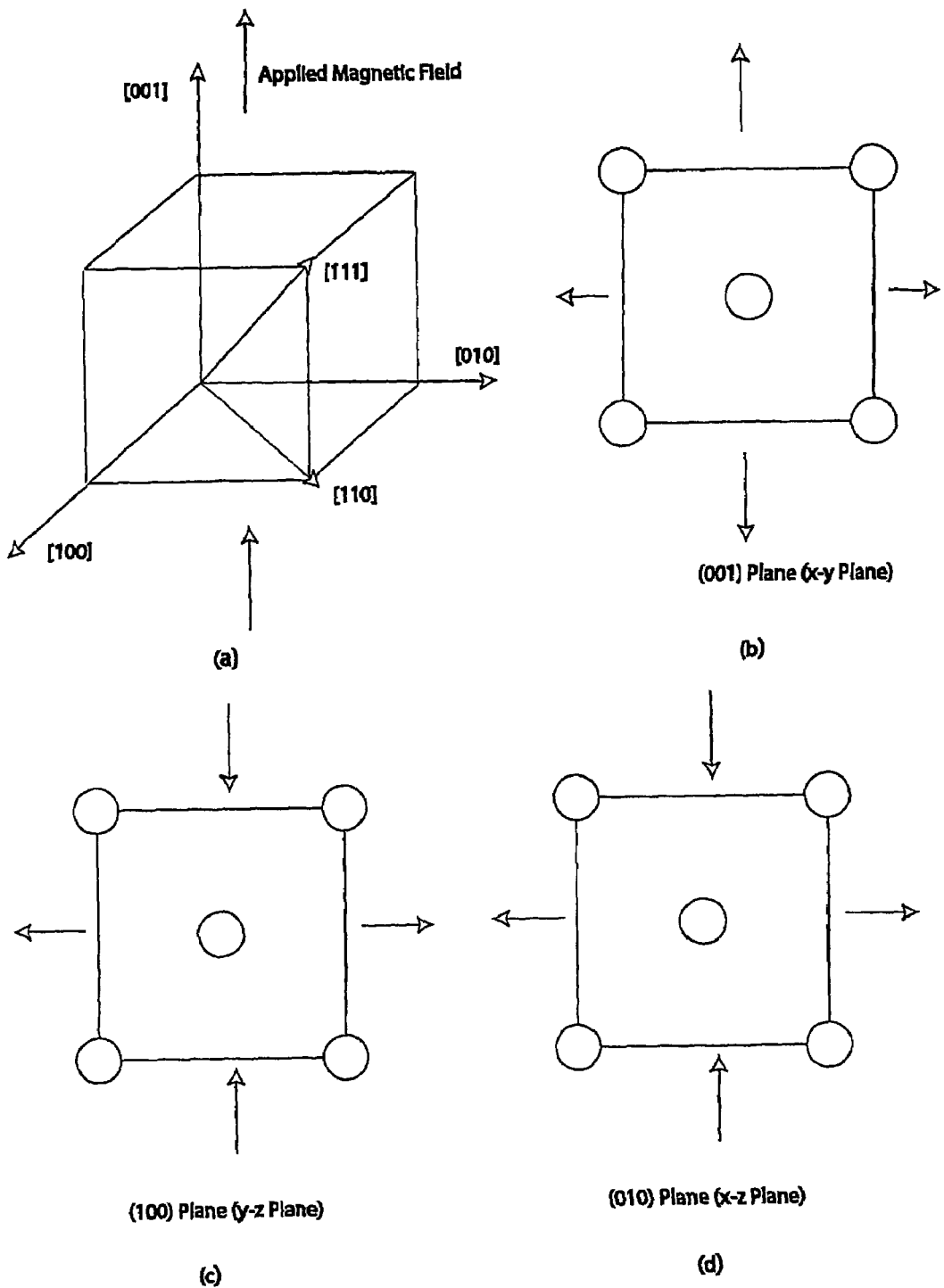
FIG. 12. Nature of distortions in the lattices of fcc NiPd, CoPd, and FePd magnetostrictive alloys on the application of magnetic field.

Pd and its alloys exhibit very large solubility for H and its isotopes and therefore are used in hydrogen or tritium storage applications. Hydrogen is an interstitial solute in Pd lattice and high concentration levels can be introduced from high-pressure gas phase or electrochemically from electrolytic solutions. Hydrogen/metal atom ratios approaching 1 can be obtained by electrochemical loading technique. Vacancy site shapes and sizes can be modified by the application of magnetic field in alloys of $Pd_x(Fe,Co,Ni)_{1-x}$ system that exhibit appreciable magnetostriction. Large magnetostriction can be obtained in Pd alloyed with Ni, Co and/or Fe. The nature of distortions that are obtained on the application of the magnetic field in these alloys is illustrated in FIG. 12(a–d). On the application of magnetic field in the [001] direction, lattice contraction occurs along [001] direction and lattice expansion occurs along [100] and [010] directions (FIG. 12a). The (001) plane expands in all directions (FIG. 12b). In the (100) plane and the (010) planes there is a contraction along one direction and expansion along the orthogonal direction (FIGS. 12c and d). Depending on the direction of applied field with respect to crystal axis, nature of distortions will be different. This distortion will change the solubility and diffusivity/permeability of H and other interstitial solutes appreciably. Solubility and diffusivity measurements in Pd and its alloys have been extensively investigated [22–27]. However, these measurements have not been carried out under the influence of magnetostrictive strain. As aspect of this invention involves the application of the magnetostrictive distortion to (i) modifying/controlling the solubility and diffusion behavior in hydrogen storage systems involving $Pd_xNi_{1-x}$, $Pd_xFe_{1-x}$, $Pd_xCo_{1-x}$, and (Pd,Pt)(Fe,Co,Ni) based alloys where x varies from 0 to values approaching 1. Magnetostrictive modification and control of the diffusion behavior of hydrogen isotopes through these alloy diffusion membranes can be used in the control and enhancement of the isotopic enrichment process for obtaining deuterium and tritium.

Catalytic Behavior:

Pd alloys have been used as a catalyst in a number of industrial applications such as in fuel cells, in the manufacture of hydrogen or synthesis gas, dechlorination of polluted soil and ground water contaminated with such chemicals as trichloroethylene, and hydrogenation of fat [22, 28–31]. The magnetic field has been known to influence catalytic behavior and these have primarily examined systems with no large magnetostriction [32,33]. This invention discloses that large magnetostrictive distortion will significantly modify the surface electron configurations (See FIG. 12) and thus can modify the catalytic activity dramatically of $(Pd,Pt)_xM_{x-1}$ (M=Ni,Fe, and/or Co) based alloys and other related alloys for use in hydrogenation and other chemical/electrochemical processes. To demonstrate the feasibility we have used Co-85 at. % Pd alloy as a cathode in an electrochemical cell containing a platinum anode and 0.1 M NaOH solution. The preliminary indications are that catalytic activity in these alloys can be manipulated using magnetic field induced (magnetostrictive) strains.

The invention disclosed here also pertains to the choice of the NiPd, FePd and CoPd alloy systems for use as highly magnetostrictive actuator and sensor and the modification of curie temperatures of these alloys to near room or higher temperature by varying the composition to produce numerous energy conversion and smart devices.

Practical and Commercial Applications:

The areas of technical interest are hydrogen storage, control of catalytic activities, magnetostriction control of diffusion/leakage of atomic species, fuel cells, actuators, sensors, ultrasonics, and acoustics. The controlled solubility/diffusion/leakage of the H in Ni—Pd based alloys and other related ferromagnetic hydrogen storage alloys using magnetic fields allows for elegant storage/delivery of hydrogen in fuel cell applications. The control and enhancement of catalytic activity in (i) Pd and Pt based alloys containing ferromagnetic additions of Ni, Fe and Co and (ii) Ni based alloys in wide range of petrochemical and other processes. The magnetic control of diffusion/leakage of hydrogen (H), deuterium (D) and tritium (T) in Pd alloyed with Ni allows for an elegant control/enhancement of isotopic enrichment process. The magnetostrictive control of solubility/diffusion/leakage of T in Pd alloyed with Ni allows in radioactive tritium isotope storage. (Pd,Pt)(Ni,Fe,Co)(H) based alloys and related alloys are also of interest in (i) torques/load sensors, (ii) linear motors/actuators,(iii) generation and sensing of acoustic and ultrasonic waves (speakers), (iv) active damping and vibration/seismic isolation structures.

While this invention has been described with reference to certain specific embodiments and examples, it will be recognized by those skilled in the art that many variations are possible without departing from the scope and spirit of this invention, and that the invention, as described by the claims, is intended to cover all changes and modifications of the invention which do not depart from the spirit of the invention.

REFERENCES

1. E. Tremolet, *Magnetostriction: Theory and Applications of Magnetoelasticity*, CRC Press, (1993) pp 1–408.
2. B. S. Chandrasekhar, Magnetostriction, in Encyclopedia of Physics, $2^{nd}$ Edition, Eds. R. Lerner and G. Trigg, VCH publishers, New York (1991) pp 690–691.
3. B. D. Cullity, *Introduction to Magnetic Materials*, Addison-Wesley, Boston, Mass. (1972) pp 1–666.
4. A. Nash and P. Nash Ni—Pd phase diagram, in Binary Alloy Phase Diagrams, $2^{nd}$ Edition, Ed. in Chief: T. B. Massaiski, ASM International, Materials Park, Ohio (1990).

5. T. Nishizawa and K. Ishida, Co—Pd, phase diagram, in Binary Alloy Phase Diagrams, 2$^{nd}$ Edition, Ed. in Chief: T. B. Massalski, ASM International, Materials Park, Ohio (1990).
6. H. Okamoto, Fe—Pd phase diagram, in Binary Alloy Phase Diagrams, 2$^{nd}$ Edition, Ed. in Chief: T. B. Massalski, ASM International, Materials Park, Ohio (1990).
7. R. G. Annaev, S. Yazliev, A. Orazsakhatov, and M. Rozyev, 'The Linear Magnetostriction of Alloys of the Ni—Pd System at Liquid Nitrogen Temperatures', Izv. Akad. Nauk. Turkm. SSR, Vol. 3 (1968) pp. 26–30.
8. R. G. Annaev et al., Izv. Akad. Nauk. Turkm. SSR, Vol. 6 (1963).
9. Tokunaga, T; Fujiwara, H Magnetostriction and Magnetic Anisotropy of Ni and Ni—Pd Alloys, J. Phys. Soc. Jpn., vol. 45, no. 4, pp. 1232–1238, October 1978
10. Tokunaga, T; Tange, H; Goto, M, Forced Magnetostriction of Ni—Pd Alloys, J. Phys. Soc. Japan, April 1973, 34, (4), 1103
11. Holscher, H; Franse, J J M, Thermal Expansion and Magnetostriction in Pd—Ni Alloys Around the Critical Concentration for Ferromagnetism (=2.3 At.- % Ni), J. Magn. Magn. Mater., vol. 15–18, II, pp. 605–606, January-March 1980
12. S. Jen and B L. Chao, Magnetostriction of polycrystalline Co—Pd alloys, Journal of Applied Physics, 75, 10-2A, (1994) 5667–5669.
13. K. Niwa and M. Shimizu, Forced Magnetostriction of Dilute Pd and Pt Alloys With Fe and Co Atoms, J. Phys. F (Met. Phys.), 12, No. 3, (1992) pp. 559–569.
14. T. F. Smith, W. E. Gardner, J. I. Budnick, Field dependence of the stiffness constant for dilute Palladium-Iron alloys, Phys Lett, 12 Aug. 1968, 27a, -6-, 326–327
15. Creuzet, G; Hamzic, A; Campbell, I A, Shape Magnetostriction in Pd Based Alloys and in Pd Metal, Solid State Commun., vol. 39, no. 3, pp. 451–452, July 1981
16. Miyata, N; Karnimori, T; Goto, M, Magnetostriction Constants of Pd sub 1-x Fe sub x Crystals ($0.1 \leq x \leq 0.6$), J. Phys. Soc. Jpn., vol. 55, no. 6, pp. 2037–2042, June 1986
17. Schmidt and Berger, J. Appl. Phys., 55 (1984) 1073.
18. M. R. Ibarra, P. A. Algarabel, C. Marquina, Y. Otani, S. Yuasa, H. Miyajima, Giant room temperature volume magnetostriction in an Fe—Rh—Pd Alloy, J. Magn. Magn. Mater., 140–144, Part I (1995) 231–232.
19. Kubota, T; Okazaki, T; Furuya, Y; Watanabe, T, Large magnetostriction in rapid-solidified ferromagnetic shape memory Fe—Pd alloy, Journal of Magnetism and Magnetic Materials (Netherlands), 239, No. 1–3 (2002) 551–553.
20. Takezawa, T; Yokoyama, T, Change in Volume on Ordering of Iron—(50–80 At.- %) Palladium Superlattice Alloys, J. Jpn. Inst. Met., 45, No. 11 (1981) 1112–1118. 1981
21. L. R. Bidwell and R. Speiser, 'Unit-cell Dimensions of Ni—Pd Alloys at 25 and 900° C,', Acta. Cryst., No. 17, pp. 1473–1474, (1964).
22. E. M. Savitskiy, Editor, Precious Metals—Handbook, "Metallurgiya", Moscow, USSR (1984), and English Edition, Hemisphere Publishing Corp. (1989) (Also see E. M. Savitskii, V. P. Poliakova, M. A. Tylkina, Palladium alloys, Primary Sources, New York, [c1969])
23. Flanagan, T B; Luo, S; Zhang, W, Hydrogen solution in homogeneous Pd—Fe alloys, Journal of Alloys and Compounds (Switzerland), vol. 293–295, pp. 1–6, 20 Dec. 1999.
24. Ying, J Y; Bryden, K J, Electrodeposition synthesis and hydrogen absorption properties of nanostructured palladium-iron alloys, Nanostructured Materials (UK), vol. 9, no. 1–8, pp. 485–488, 1997
25. Y. Sakamoto, Nickel-hydrogen system, Diffusion and Defect Data Pt.B: Solid State Phenomena, v73, 2000, p 137–205
26. Yamakawa, K; Ege, M; Ludescher, B; Hirscher, M; Kronmuller, H Hydrogen permeability measurement through Pd, Ni and Fe membranes, Journal of Alloys and Compounds (Switzerland), vol. 321, No. 1 (2001) 17–23.
27. Frieske, H; Mahnig, M, Paramagnetic Behaviour of Palladium-Iron and Palladium-Iron-Hydrogen alloys, Z. Naturforsch, 1969, A 24, 11, 1801–1806
28. F. A. Lewis, Pd and its alloys,.Palladium-hydrogen. London, New York, Academic Press, 1967.
29. Korte, N; Liang, L; Muftikian, R; Grittini, C; Fernando, Q The dechlorination of hydrocarbons. Palladised iron utilized for ground water purification, Platinum Metals Review (UK), vol. 41, no. 1, pp. 2–7, January 1997
30. F. Sakyu, N. Takada, H. Iinura, T. Komata, Central Glass Company, Limited; Nippon Zeon Co., Ltd, U.S. Pat. No. 6,166,276, Method for producing heptafluoropentane (2000)
31. A. Jart, Aage, Magnetic field as an additional selectivity parameter in fat hydrogenation, JAOCS (J. Amer. Oil Chemists' Soc.) 74, No. 5 (1997) 615–617.
32. J. T. Richardson, Magnetism and catalysis, J Appl Phys v 49(1978) 1781–1786.
33. R. J. H. Voorhoeve, Experimental relationships between catalysis and magnetism, Proc. 19$^{th}$ Ann. Magn and Magn Mater. Conf., Nov. 13–16 1974, Boston, Mass., APS, (1974) pp 19–32.

What is claimed is:

1. A method for controlling a chemical property of an alloy, comprising:
   providing a magnetostrictive alloy having one or more of Pd and Pt, and one or more of Ni, Co, and Fe, wherein the magnetostrictive alloy comprises one or more of $Pd_xNi_{1-x}$, $Pd_xFe_{1-x}$, $Pd_xCo_{1-x}$, $Pt_xNi_{1-x}$, $Pt_xFe_{1-x}$, $Pt_xCo_{1-x}$, where x is less than 1; and
   subjecting the magnetostrictive alloy to a magnetic field, the magnetic field being adjusted to a strength to obtain a preselected value of a chemical property in the magnetostrictive alloy, the chemical property being diffusivity, solubility, catalytic activity, or combinations thereof.

2. The method of claim 1, wherein the chemical property is diffusivity or solubility.

3. The method of claim 1, wherein the chemical property is catalytic activity.

4. A method for storing hydrogen comprising providing a magnetostrictive alloy and subjecting the alloy with a variable magnetic field to controllably vary the solubility and diffusion properties for hydrogen of the alloy to effect the selective variation of solubility and diffusion of hydrogen, said magnetostrictive alloy having:
   (a) one or more of Pd and Pt, and
   (b) one or more of Ni, Co, and Fe,
   where the magnetostrictive alloy comprises one or more of $Pd_xNi_{1-x}$, $Pd_xFe_{1-x}$, $Pd_xCo_{1-x}$, $Pt_xNi_{1-x}$, $Pt_xFe_{1-x}$, $Pt_xCo_{1-x}$, where x is less than 1.

5. The method for storing hydrogen as in claim 4, wherein the variation of solubility and diffusion of hydrogen is in response to the storage and delivery needs of hydrogen for a fuel cell.

6. The method for storing hydrogen as in claim 4, wherein the hydrogen contains two or more of hydrogen (H), deuterium (D), and tritium (T) and the variation of solubility and diffusion of hydrogen is to effect isotropic separation.

7. The method for storing hydrogen as in claim 4, wherein the hydrogen contains tritium (T).

8. The method as in claim 1, wherein a Curie temperature of the alloy is at or near room temperature or at a higher temperature.

9. The method as in claim 1, wherein a melting point of the alloy is at a congruent melting point minimum.

* * * * *